United States Patent [19]

Amrany

[11] Patent Number: 5,319,585
[45] Date of Patent: Jun. 7, 1994

[54] HIGH RESOLUTION FILTERING USING LOW RESOLUTION PROCESSORS

[75] Inventor: Daniel Amrany, Wayside, N.J.

[73] Assignee: AT&T Bell Laboratories, Murray Hill, N.J.

[21] Appl. No.: 54,370

[22] Filed: Apr. 28, 1993

Related U.S. Application Data

[63] Continuation of Ser. No. 796,143, Nov. 22, 1991, abandoned.

[51] Int. Cl.$^5$ .............................................. G06F 15/31
[52] U.S. Cl. ................................................ 364/724.19
[58] Field of Search ............ 364/724.19, 724.2, 724.02

[56] References Cited

U.S. PATENT DOCUMENTS

| | | | |
|---|---|---|---|
| 4,792,915 | 12/1988 | Adams et al. | 364/724.19 |
| 4,811,360 | 3/1989 | Potter | 364/724.2 |
| 4,856,031 | 8/1989 | Goldstein | 364/724.19 |
| 4,922,530 | 5/1990 | Kenney et al. | 364/724.19 |
| 5,005,185 | 4/1991 | Mizoguchi et al. | 364/724.2 |
| 5,007,007 | 4/1991 | Zanten et al. | 364/724.19 |
| 5,014,232 | 5/1991 | André364 | 724.19/ |

Primary Examiner—David H. Malzahn
Attorney, Agent, or Firm—Henry T. Brendzel

[57] ABSTRACT

A high-speed digital filter with a large dynamic range is constructed by operating two low-resolution filters in parallel, which is referred to as an "overlap" mode of operation. In this overlap mode of operation, both low-resolution adaptive filters operate on the input data simultaneously, however, the characteristics of both filters are controlled so that one filter performs a coarse level of filtering, while the other filter performs a finer level of filtering and also removes any errors introduced by the first filter. Some application examples include echo canceling, equalization, and deghosting filters.

14 Claims, 4 Drawing Sheets

HIGH RESOLUTION FILTERING USING LOW RESOLUTION PROCESSORS

This application is a continuation of application Ser. No. 07/796,143, filed on Nov. 22, 1991, now abandoned.

BACKGROUND OF THE INVENTION

The present invention relates to filtering techniques used in data communications.

Over the coming years, more sophisticated and more complex data services will be offered not only to the business sector but to sector residential sector as well. As a result, data communications equipment will be required to support higher and higher data rates in order to bring these sophisticated and complex data services to the home.

Typically in the residential sector, a full-duplex modem is used to deliver data services over a single communications channel, which is typically a twisted pair of telephone wires. In order to accommodate full-duplex operation, signal energies from both directions of transmission must be superimposed on this single communications channel simultaneously. As a result, some signal energy from each direction of transmission inevitably leaks through to the opposite direction path. This cross-path leakage allows some of a modem's transmitted signal to appear at the input of its own receiver. This undesired leaked-through signal is often referred to as "echo." An echo signal can seriously degrade a modem receiver's performance if not mitigated. Although the echo cannot simply be filtered, it can be reduced to acceptable levels through the use of an adaptive filter that is configured as an "echo canceler" within the modem. The echo canceler adaptively synthesizes a replica of the echo, which is then subtracted from the received signal, leaving a substantially echo-free signal. This echo-compensated signal is applied to the modem's data receiver. The echo canceler technique has been so successful that it now is a standard component in most full-duplex high-speed modems.

In addition to the presence of echo, the presence of amplitude and delay distortion in the transmission medium gives rise to intersymbol interference. Intersymbol interference results in errors in determining the value of the transmitted signal at the receiver since adjacent transmitted symbols begin to overlap with one another. To combat the effects of amplitude and delay distortion, another form of an adaptive filter, known as an equalizer, is typically used in a modem.

Today, the adaptive filter, whether for echo canceling or equalization, is typically a digital adaptive filter, which is required to perform a number of filtering operations in each sample interval of an input signal. At the heart of the filtering operations is the completion of numerous multiplication operations within the sampling interval. The speed of a multiplication operation is dependent on the size, i.e., the dynamic range or resolution, of the numbers that are being multiplied together. Consequently, as data rates increase to support new data services, the amount of time, i.e., the sampling interval, available to complete the numerous multiplications decreases. Eventually, the sampling interval becomes so short that the existing digital adaptive filter must be redesigned in order to perform the required filtering operations at the given dynamic range. Unfortunately, any redesign entails additional design and implementation cost. Similarly, as greater accuracy is demanded, a larger dynamic range is required and that also increases the integrated circuit complexity because more calculations are required within the same sampling interval.

SUMMARY OF THE INVENTION

In accordance with the invention, the redesign of an adaptive filter to support a greater dynamic range is avoided by the use of two low-resolution adaptive filters operating in parallel, i.e., in an "overlap" mode. In this overlap mode of operation, both low-resolution adaptive filters operate on the input data simultaneously. However, the characteristics of both filters are controlled so that one filter performs a coarse level of filtering, while the other filter performs a finer level of filtering and also removes any errors introduced by the first filter.

In accordance with a feature of the invention, the characteristics of the first filter are "trained" during an initialization period, while the characteristics of the second filter are held constant. During operation, the characteristics of the first filter are held constant, while the characteristics of the second filter are trained.

In separate embodiments of the invention, two low-resolution filters are configured in an overlap mode of operation as applied to an echo canceler and an equalizer.

DETAILED DESCRIPTION

Figure 1:
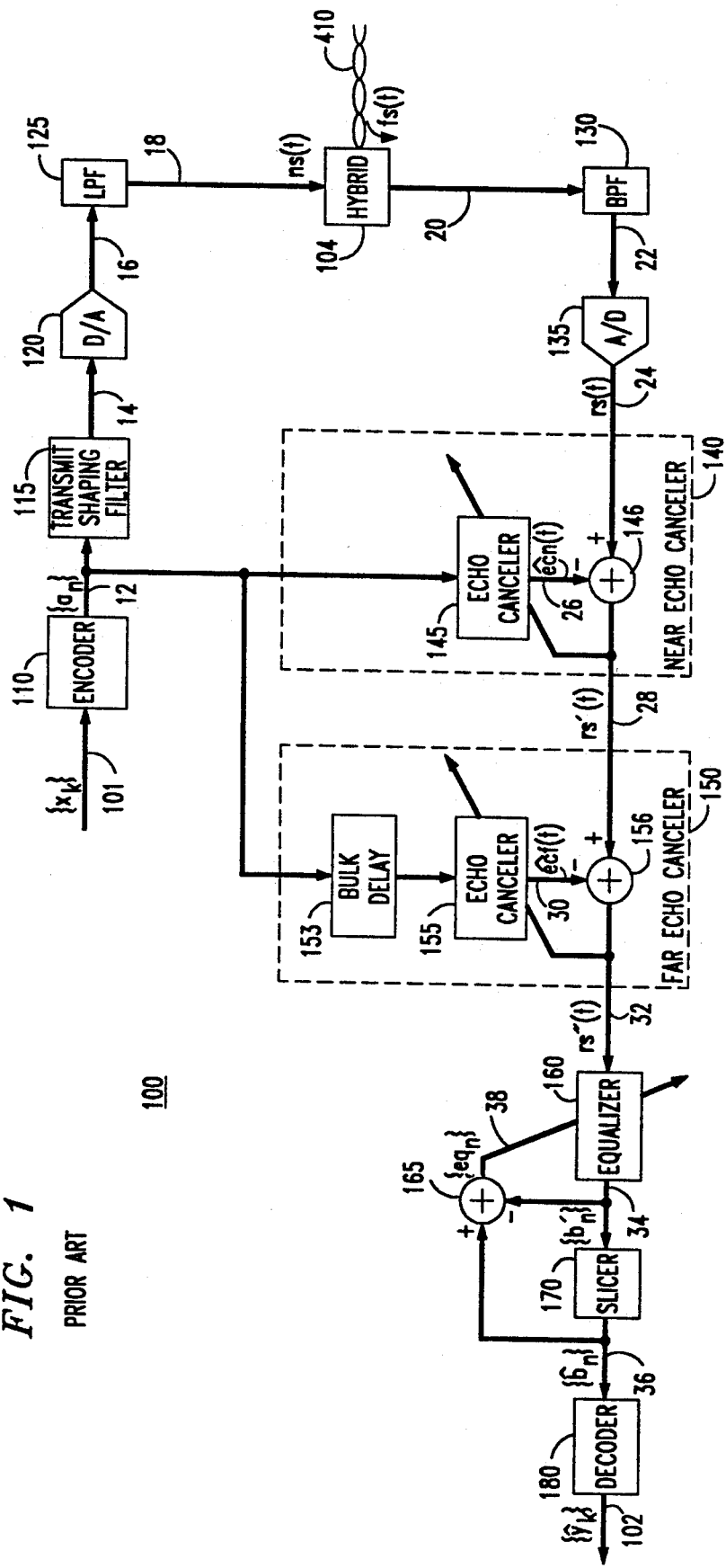
FIG. 1 is a block diagram of a prior art modem structure.

The structure of modem 100 as illustrated in FIG. 1 is representative of prior art echo cancelling modems and the operation of the various components is well-known. The binary input data sequence $\{x_k\}$ to modem 100 is first processed by encoder 110, which outputs a sequence of complex-valued symbols $\{a_n\}$, at nominal rate 1/T symbols per second, which are representative of the input data sequence and may also include scrambling, redundancy and other forms of encoding. Symbol sequence $\{a_n\}$ is then processed by transmit shaping filter 115, the output of which is applied to analog-to-digital converter (D/A) 120. The resulting analog signal is filtered by low-pass filter (LPF) 125, forming a near-end transmitted signal, ns(t). The latter is coupled into channel 410 by hybrid 104. Illustratively, modem 100 employs quadrature amplitude modulation (QAM) and channel 410 is a twisted-pair, or two-wire loop, that is typically connected to a telephone central office (not shown).

In the other direction of communication, an analog line signal, fs(t), transmitted from a far modem (not shown) is received by hybrid 104 and is directed to bandpass filter (BPF) 130. This signal is referred to as the "far-end data signal," and utilizes the same frequency band as the transmitted signal, ns(t), i.e., modem 100 is a full-duplex modem. Bandpass filter 130 removes energy outside the signal passband from the far-end data signal, which is then converted to digital form by analog-to-digital (A/D) converter 135 to form received signal rs(t).

The signal, fs(t), reaching the input of bandpass filter 130 is corrupted by so-called near and far echoes. The near echoes comprise transmit signal energy which, rather than having been directed to the channel by hybrid 104, has leaked through the hybrid. The far echoes are comprised of signal energy which was directed onto channel 410 in the first instance but was reflected back to the modem as the result, for example, of impedance mismatches and other channel anomalies. The received signal, rs(t), provided by analog-to-digital converter 135, thus contains not only energy from the far-end data signal, but also near and far echo energy.

Accurate recovery of the data represented by the far-end data signal requires that the echo energy present in the samples on lead 24 be removed. To this end, near-end echo canceler 140 processes received signal rs(t). Near-end echo canceler 140 comprises echo canceler 145 and adder 146. Echo canceler 145 forms a near echo estimate, $\hat{e}n(t)$, which approximates the actual near echo signal present in received signal rs(t). Echo canceler 145 is essentially a filter whose transfer function is adaptively determined so as to emulate the "echo path," i.e., all filtering operations encountered by the locally transmitted symbol sequence $\{a_n\}$ from transmit filter 115 through A/D converter 135. At adder 146, $\hat{e}n(t)$ is subtracted from rs(t) so as to produce a substantially near echo-free signal, rs'(t).

The near echo-free signal rs'(t) is then processed by far-end echo canceler 150, which comprises bulk delay element 150, echo canceler 155 and adder 156. Bulk delay element 150 approximates the group delay of the far echo path and provides a delayed version of the locally transmitted symbol sequence, $\{a_n\}$. Operating similarly to echo canceler 145, echo canceler 155 generates on lead 30 an echo estimate of the far echo signal, $\hat{e}f(t)$. (For simplicity it is assumed that the far echo signal is not effected by frequency translation, which would also require the far echo estimate signal, $\hat{e}f(t)$, to be similarly effected.) At adder 156, $\hat{e}f(t)$ is subtracted from rs'(t) so as to produce a substantially far echo-free signal rs''(t). Thus, rs''(t) consists primarily of the far-end signal, plus any noise introduced by the channel and the various receiver elements (e.g., quantization error introduced by analog-to-digital converter 135).

Further processing of signal rs''(t) is performed by equalizer 160, which compensates for intersymbol interference introduced by channel 410. Equalizer 160 provides symbol sequence $\{\hat{b}_n'\}$ to slicer 170. The latter operates upon the sequence $\{\hat{b}_n'\}$ by quantizing the sequence $\{\hat{b}_n'\}$ to form estimated symbol sequence $\{b_n\}$. The latter is applied to adder 165 (discussed below), and decoder 180, which performs a symbol-to-bit mapping function and in turn yields an estimate, $\{y_k\}$, of the binary sequence, $\{y_k\}$, transmitted by the far modem.

As mentioned above, both equalizer 160 and echo cancelers 145 and 155 are filters, and within the context of this example are FIR digital filters. Typically in an FIR digital filter, at time n, the digital output signal, $Y_n$, is $$Y_n = \sum_{k=1}^{k=m} C_k{}^n X_{n-k},\tag{1}$$

where $Y_n$ is the output at time n, $C_k{}^n$ is the $k^{th}$ coefficient at time n (this assumes that coefficients may change from time to time), and $X_{n-k}$ represents a sample of a digital input signal X(t) before time n. Typically the collection of samples, $X_{n-1}$ through $X_{n-m}$, are stored in a tapped delay line. The characteristics of the filter are determined by the values of coefficients $C_1{}^n$ through $C_m{}^n$ at time n. Each coefficient is also called a tap weight or tap coefficient. The coefficient, $C_k{}^n$, multiplies the respective sample of X(t) with the result that $Y_n$ is equal to the sum of the products of the coefficients and the respective m samples of X(t). The coefficients themselves are changed, or adaptively updated, in accordance with the following formula:

$$C_k{}^{n+1} = C_k{}^n + \beta e_n X_{n-k},\tag{2}$$

where $C_k{}^{n+1}$ represents the value of $C_k$ at time n+1, $\beta$ is typically a fraction, and $e_n$ is an error signal that is used to adjust the coefficients at time n. This process of adaptively updating the coefficients is also referred to as "training" the coefficients.

In the context of echo canceler 145, $X_{n-k}=a_{n-k}$, and the error signal, $e_n$, is a function of the near echo-free signal, rs'(t) at time n, so that equation (2) becomes $$C_k{}^{n+1} = C_k{}^n + \beta rs_n' a_{n-k},\tag{3}$$

where typically $\beta \approx 2^{-11}$. A similar description applies to echo canceler 155.

In the context of equalizer 160, $X_{n-k}=rs_{n-k}''$, and the error signal, $e_n$, is equal to the error signal, $eq_n$, which is applied to equalizer 160 via lead 38. Therefore, equation (2) becomes $$C_k{}^{n+1} = C_k{}^n + \beta eq_n rs_{n-k}'',\tag{4}$$

where typically $\beta \approx 2^{-7}$, and $eq_n$ is equal to $$eq_n = \hat{b}_n - b_n',\tag{5}$$

In light of equation (5), adder 165 of FIG. 1 subtracts $\hat{b}_n'$ from $b_n$ to provide the error signal $eq_n$.

As can be seen from equation (1) above, a digital filter is required to perform a number of calculations for each sample of the output signal it provides. While the coefficients can always be updated slowly, the numerous multiplications of $C_k{}^n \times X_{n-k}$ shown in equation (1) need to be done within each sample interval. The speed of a multiplication operation is dependent on the size, i.e., the dynamic range or resolution, of the numbers that are being multiplied together. The dynamic range is important since it represents the degree to which nearly equal values of a quantity can be discriminated. Within the context of this example, the dynamic range is simply the number of bits used to represent a digital signal.

In a digital filter there are two dynamic ranges that must be considered—the sample size and the coefficient size. The sample size is limited by the analog-to-digital converter that provides the sample and is typically less than the size, or dynamic range, of the coefficient, $C_k{}^n$. Since the size of the coefficient, $C_k{}^n$ is typically larger, it has more of an effect on the speed of the multiplication operation. As used herein, dynamic range will refer to the dynamic range of the coefficients.

In consideration of the above, it can be appreciated that as data rates increase to provide new data services, the amount of time available to perform the numerous multiplications decreases. Eventually, the existing digital adaptive filter must be redesigned in order to perform the required filtering operations within the shorter sampling interval at the given dynamic range. Unfortunately, any redesign entails additional design and implementation cost since this may involve a switch to a different and faster technology or an architectural redesign of the filter. Similarly, greater accuracy is demanded, a larger dynamic range is required and that also increases the integrated circuit complexity because more calculations are required within the same sampling interval. However, and in accordance with the invention, the redesign of a high-resolution filter is avoided by using two low-resolution filters in an overlap mode. In this overlap mode of operation, the first digital filter processes the high levels of the input signal, while the second digital filter cleans the low levels of the input signal and any errors of the first digital filter. As a result, the overlap mode of operation allows the numerous multiplications to be performed at a lower resolution, which, therefore, requires less time to complete. Since less time is required to complete the filter operations, either higher data rates for a given dynamic range can be supported, or the dynamic range can be increased.

The overlap mode of operation is illustrated with the following example. Assume that the dynamic range of $C_k^n$ is equal to 24 bits. However, each 24 bit coefficient, $C_k^n$, can be rewritten as:

$$C_k^n = C_k^{n,1} + \alpha C_k^{n,2}, \tag{6}$$

where the number of bits used to represent coefficient $C_k^{n,1}$ and coefficient $C_k^{n,2}$ is less than the number of bits used to represent $C_k^n$, i.e., less than 24 bits. It should be noted that $C_k^n$ as well as $C_k^{n,1}$ and $C_k^{n,2}$ have the decimal point to the left of the coefficient digits, i.e., they are fractions. In equation (6), $\alpha$ is equal to:

$$\alpha = 1/(2^j), \tag{7}$$

where, $$j = \text{number of bits of } C_k^n - \text{number of bits of } C_k^{n,2}. \tag{8}$$

Figure 2:
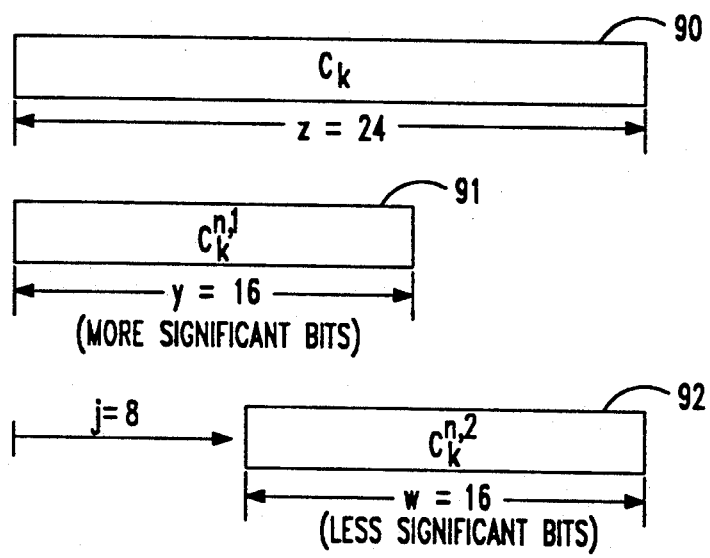
FIG. 2 is a block diagram illustrating the realization of a wide dynamic range in accordance with the principles of the invention.

The relationship between $C_k^n$, $C_k^{n,1}$ and $C_k^{n,2}$ is shown in FIG. 2. The dynamic range of $C_k^n$, z, is 24 bits, which is simply represented by 24 bit register 90. In accordance with the invention, this dynamic range is also provided by the overlap of registers 91 and 92, which represent the coefficients $C_k^{n,1}$ and $C_k^{n,2}$, respectively. Illustratively, the dynamic range of $C_k^{n,1}$, y, is 16 and $C_k^{n,2}$, w, is 16 bits. Therefore, from equation (8), j is calculated to be equal to 8 (i.e., z−w) and, from equation (7), $\alpha = 1/(2^8) = 0.0039062$. In actual design, registers 91 and 92 do not actually have to overlap, however, the number of bits in register 91 must be greater than or equal to j.

As shown in FIG. 2, coefficient $C_k^n$ is a 24 bit number, coefficient $C_k^{n,1}$ represents the 16 more significant bits and is effectively a 24 bit number with eight zeroes as the least significant bits, and $C_k^{n,2}$ is also effectively a 24 bit number that represents the less significant bits. In light of equation (6), equation (1) becomes:

$$Y_n = \sum_{k=1}^{k=m} (C_k^{n,1} + \alpha C_k^{n,2}) X_{n-k}. \tag{9}$$

or, $$Y_n = \sum_{k=1}^{k=m} C_k^{n,1} X_{n-k} + \alpha \sum_{k=1}^{k=m} C_k^{n,2} X_{n-k}. \tag{10}$$

Since the number of bits used in each coefficient $C_k^{n,1}$ and $C_k^{n,2}$ is now less than the number of bits in coefficient $C_k^n$, this results in low-resolution multiplications being performed on each sample of $X_{n-k}$ that are faster—with the result that a higher dynamic range is achieved using lower-resolution coefficients in accordance with the invention.

Figure 3:
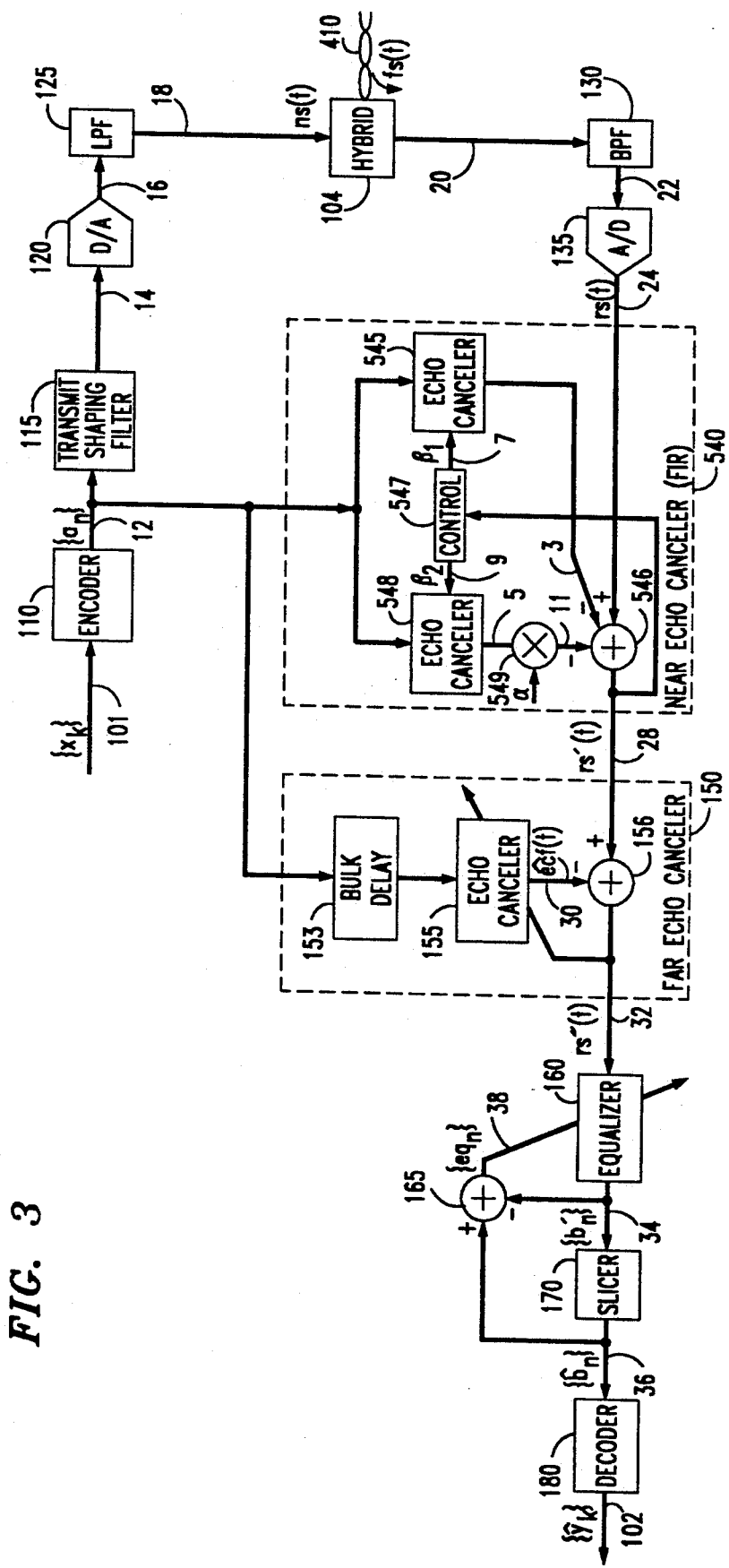
FIG. 3 is a block diagram of a modem structure embodying the principles of the invention.

An embodiment of the invention is shown in FIG. 3. In accordance with a feature of the invention, echo canceler 140 of FIG. 1 is replaced by echo canceler 540, all other components of FIG. 3 function as described above. Echo canceler 540 comprises echo cancelers 545 and 548, control element 547, multiplier 549, and adder 546. Echo cancelers 545 and 546 are FIR digital filters as described above, and as is shown in FIG. 3 operate in parallel on locally transmitted symbol sequence {$a_n$}. The output of echo canceler 545 is provided to adder 546, via lead 3, and the output of echo canceler 548 is multiplied by $\alpha$ via multiplier 549, which provides the product to adder 546 via lead 11. The latter sums the received signal rs(t) with the signals provided on leads 3 and 11 to provide the near echo-free signal rs'(t) on lead 28.

The signal rs'(t) is also applied to control element 547, which controls how the coefficients of echo cancelers 545 and 548 are updated. The coefficients of echo canceler 545 are updated, via lead 7, in accordance with equation (3), which is rewritten as:

$$C_k^{n+1,1} = C_k^{n,1} + \beta_1 rs_n' a_{n-k}, \tag{11}$$

where $\beta_1$ represents the $\beta$ value associated with echo canceler 545 and is typically a fractional number as mentioned above.

The coefficients of echo canceler 548 are updated via lead 9 and is similarly determined by:

$$C_k^{n+1,2} = C_k^{n,2} + \beta_2 rs_n' a_{n-k}, \tag{12}$$

where $\beta_2$ represents the $\beta$ value associated with echo canceler 548 and is also a fractional number as mentioned above.

Since echo cancelers 545 and 548 are operating in an overlap mode, they are simultaneously operating on the same input data. However, it may not be practical to allow both echo cancelers to continuously adapt their respective coefficient values. This may be impractical because the echo cancelers may effectively "chase each other," since each echo canceler will continually try to adapt to the output signal of the other echo canceler that is fed back via lead 28 through control element 547. As a result, and in accordance with a feature of the invention, control element 547 also controls the $\beta_1$ and $\beta_2$ values that are used in equations (11) and (12). Moreover, it is unnecessary to continually adapt both coefficients. Echo canceler 545 is the "coarse" echo canceler and it is expected that fine variations in echo characteristics with time will be small, and, therefore, be handled with ease by echo canceller 548.

Figure 4:
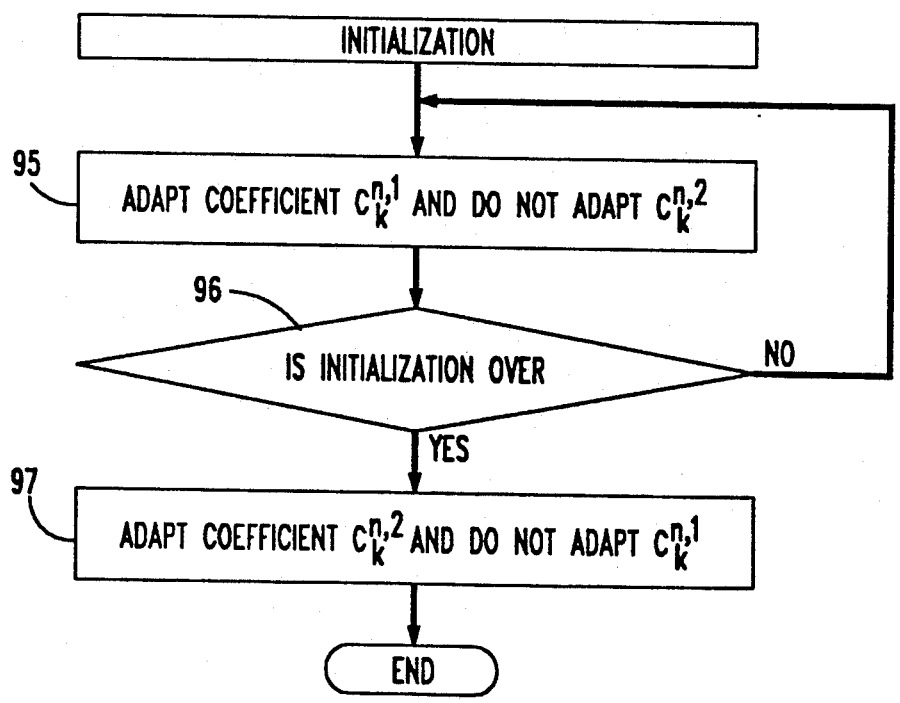
FIG. 4 is an illustrative flow diagram of a method for adapting filter coefficients used in the modem structure of FIG. 3.

An illustrative flow diagram for controlling the $\beta_1$ and $\beta_2$ values is shown in FIG. 4. In accordance with step 95, echo canceler 545 is trained during initialization of modem 100. During this initialization time, control element 547 allows echo canceler 545 to adaptively determine the values of the coefficients $C_k^{n,1}$ in accordance with equation (11), where $\beta_1$ is equal to a fractional number. However, during initialization, $\beta_2$ is set equal to zero by control element 547, with the result that during initialization—

$$C_k^{n+1,2} = C_k^{n,2}, \tag{13}$$

which are illustratively assumed equal to approximately zero. Initialization may occur each time a data communications connection is setup or power is applied to modem 100. For the purposes of this example, it is assumed that there is no incoming far-end data signal, consequently, the received signal, rs(t), comprises a near echo that is the result of transmitted signal ns(t) representing an illustrative training sequence.

In accordance with step 96, the initialization period is over when the value of the near echo-free signal approaches a small value, e.g., $rs'(t) \approx 0$. Alternatively, it may be assumed that once a pre-determined amount of time has passed, e.g., 10 milliseconds, that the initialization step is complete. At this point, in accordance with step 97, control element 547 sets $\beta_1 = 0$. As a result, during normal operation, the coefficients of echo canceler 545 do not change, i.e., $$C_k^{n+1,1} = C_k^{n,1}. \tag{14}$$

In addition, control element 547 allows echo canceler 548 to adaptively determines the values of the coefficients $C_k^{n,2}$ in accordance with equation (12), where $\beta_2$ is equal to a fractional number. As a result, echo canceler 548 is continuously adapting and not only cancels the low levels of echo in received signal rs(t) but also any errors introduced by echo canceler 545. In effect, echo canceler 545 performs a coarse level of echo cancelation, and echo canceler 548 performs a finer level of echo cancelation.

Figure 5:
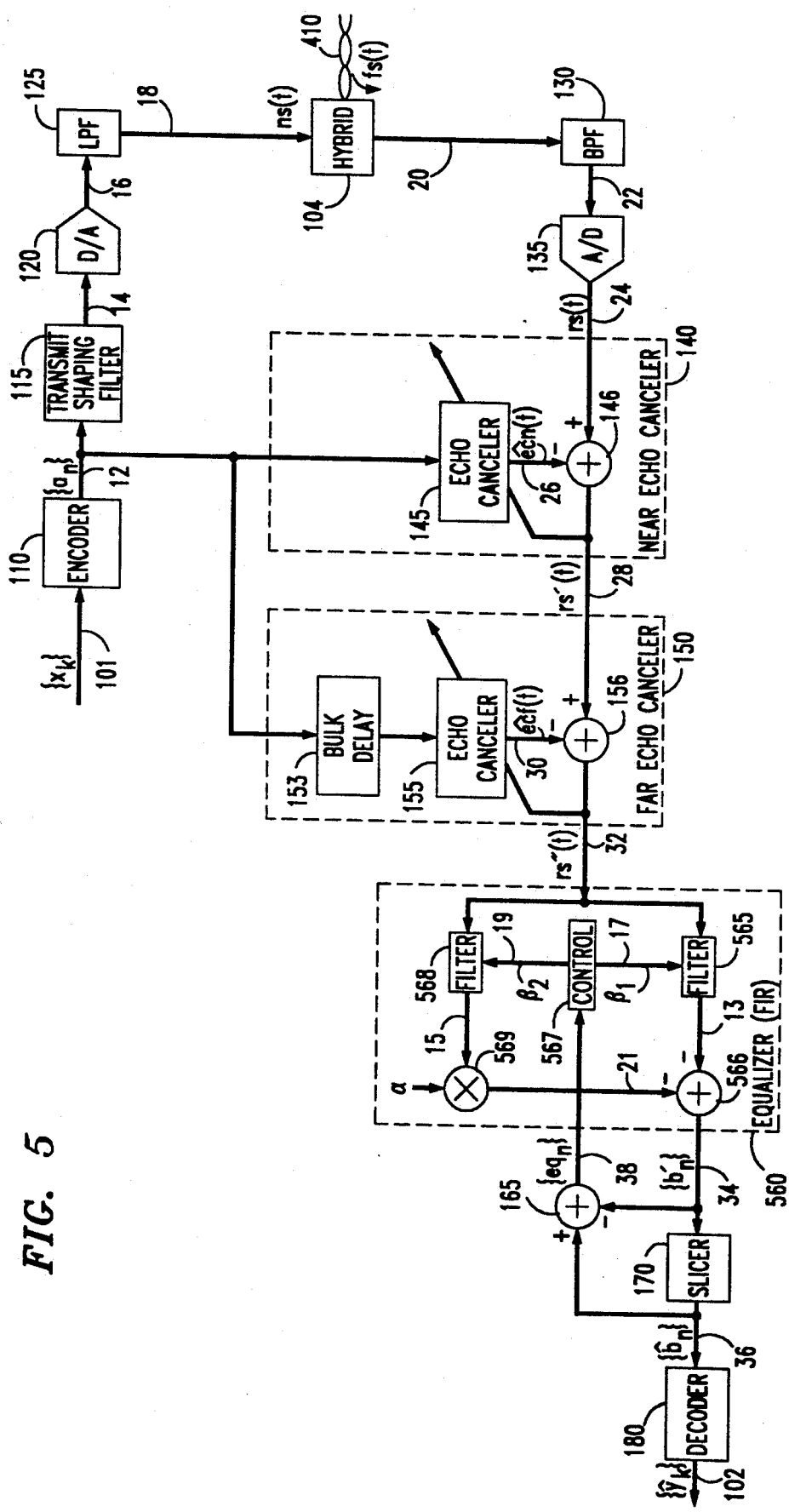
FIG. 5 is a block diagram of another modem structure embodying the principles of the invention.

Other applications of the inventive concept are also possible. For example, as shown in FIG. 5, equalizer 560 replaces equalizer 160 of FIG. 1. The configuration of equalizer 560 is similar to the configuration of echo canceler 540 except that the second input signal is set to zero. Equalizer 560 comprises filters 565 and 568, control element 567, multiplier 569, and adder 566. Filters 565 and 568 are FIR digital filters, as described above, and operate in parallel on far echo-free signal rs"(t). The output of filter 565 is provided to adder 566, via lead 13, and the output of filter 548 is multiplied by $\alpha$ via a multiplier 569, which provides the product to adder 566 via lead 21. The latter sums the signals provided on leads 13 and 21 to provide the symbol sequence $\{b_n'\}$ to slicer 170 on lead 34. Since filters 565 and 568 are used to provide equalization of input signal rs"(t), the error signal, $eq_n(t)$, as mentioned above, is applied via lead 38 to control element 567, which then adjusts the coefficients of filters 565 and 568 via leads 17 and 19, respectively. The updating of the respective coefficients for filters 565 and 568 are similar to the discussion above for echo cancelers 545 and 548 of FIG. 3, e.g., during an initialization period $\beta_2 \approx 0$, etc. It should be noted that during the initialization period, since the training sequence that is transmitted is known, the input to adder 165 may be a fixed reference signal as opposed to the output of slicer 170.

The foregoing merely illustrates the principles of the invention and it will thus be appreciated that those skilled in the art will be able to devise numerous alternative arrangements which, although not explicitly described herein, embody the principles of the invention and are within its spirit and scope.

For example, the overlap mode of operation of two filters can also be applied to "deghosting" circuits, i.e., filters that are in effect "multipath equalizers" and which are used to remove multiple images from a received signal in a receiver. The multiple images, or "ghosts," are caused by reflections of the transmitted signal. In this type of configuration an output signal is fed back through the multipath equalizer, which is comprised of two digital FIR filters configured in an overlap mode of operation. The output of the multipath equalizer is recombined with an input signal to form the output signal. In this type of equalizer, the coefficients typically are not changed during equalization of the input signal, i.e., both $\beta_1$ and $\beta_2$ are equal to zero. Any change in value of the coefficients is done off-line.

It should also be noted, that an overlap mode of operation can be similarly used for cancelation of any far echo present in a received signal.

Also, an alternative relationship between the coefficients can be expressed, where $C_k^n = \gamma C_k^{n,1} + C_k^{n,2}$, and $\gamma > 1$. This would result in an embodiment in which the coarse filter is multiplied by $\gamma$.

In addition, although the invention is illustrated herein as being implemented with discrete functional building blocks, e.g., echo cancelers, equalizers, etc., the functions of any one or more of those building blocks can be carried out using one or more appropriate programmed processors.

What is claimed is:

1. A first structure comprising:
    a first linear finite impulse response filter responsive to a first signal for providing a first output signal,
    a second linear finite impulse response filter responsive to said first signal for providing a second output signal,
    means responsive to the first output signal and to the second output signal for forming a third output signal that corresponds to the combination of the first output signal and a preselected amount of the second output signal, which amount is greater than zero, and
    means for controlling characteristics of said first filter and said second filter as a function of the third output signal.

2. The structure of claim 1 wherein said means for controlling affects the characteristics of said first filter only during a training interval.

3. The structure of claim 1 wherein said means for controlling affects the characteristics of said first filter only during a training interval, during which time characteristics of said second filter are unaffected, and at times other than said training interval the characteristics of said first filter remain unchanged while the characteristics of said second filter are modified in accordance with said output signal.

4. The structure of claim 1 wherein said means for controlling comprises a slicer responsive to said third output signal and means for subtracting from an output signal of said slicer said third output signal thereby forming a control signal for controlling characteristics of said first filter and said second filter.

5. The structure of claim 1 wherein said means for controlling scales said third output signal.

6. The structure of claim 1 wherein said means for controlling scales said third output signal by a factor $\beta_1$ for said first filter and by a factor $\beta_2$ for said second filter, where $\beta_1$ and $\beta_2$ are less than one.

7. A method for filtering a first input signal, comprising the steps of
   determining during a training interval characteristics of a first filter,
   determining after the training interval characteristics of a second filter,
   filtering the first input signal with the first filter to provide a first output signal,
   filtering the first input signal with the second filter to provide a second output signal, and
   combining the first output signal and the second output signal to provide a filtered output signal,
   where the first filter and the second filter are both linear finite impulse response filters.

8. The method of claim 7 further comprising the step of combining the filtered output signal with a second input signal to provide an output signal.

9. The method of claim 8 wherein the step of combining the filtered output signal and the second input signal subtracts the filtered output signal from the second input signal to provide the output signal.

10. Apparatus for filtering an applied signal, comprising:
    first linear finite impulse response filter means for receiving the applied signal and for providing a first output signal, where a value of the first output signal at any given time, t, is a function of a) N samples of the applied signal, where N>1, and b) a first plurality of filter coefficients having a first dynamic range;
    second linear finite impulse response filter means for receiving the applied signal and for providing a second output signal, where a value of the second output signal at said time, t, is a function of the a) N samples of the applied signal and b) a second plurality of filter coefficients having a second dynamic range;
    means responsive to the first output signal and to the second output signal for forming a third output signal that corresponds to the combination of the first output signal and a preselected amount of the second output signal, which amount is greater than zero; and
    means for updating the first and second plurality of filter coefficients as a function of the third output signal;
    where the preselected amount is equal to the inverse of two raised to the power k, where k is equal to the difference between the dynamic range of the first plurality of filter coefficients and the dynamic range of the second plurality of filter coefficients.

11. Apparatus for filtering an applied signal, comprising:
    first linear finite impulse response filter means for receiving the applied signal and for providing a first output signal;
    second linear finite impulse response filter means for receiving the applied signal and for providing a second output signal;
    means for combining the first output signal and the second output signal to provide a third output signal; and
    means for controlling the characteristics of the first filter and the second filter as a function of the third output signal;
    where the first filter means performs a coarse filtering of the applied signal relative to the second filter means which performs a finer filtering of the applied signal.

12. Apparatus for filtering an applied signal, comprising:
    first linear finite impulse response filter means for receiving the applied signal and for providing a first output signal;
    second linear finite impulse response filter means for receiving the applied signal and for providing a second output signal;
    means for scaling the second output signal by a number, $\alpha$, to provide a scaled second output signal;
    means for combining the first output signal and the scaled second output signal to provide a third output signal; and
    means for controlling characteristics of the first filter and the second filter as a function of the third output signal;
    where the characteristics of the first filter means are represented by a first set of filter coefficients having a first dynamic range, and the characteristics of the second filter means are represented by a second set of filter coefficients having a second dynamic range, and where the number $\alpha$ is equal to the inverse of two raised to the power k where k is equal to the difference between the first dynamic range and the second dynamic range.

13. A method for filtering an input signal comprising the steps of:
    operating a first linear finite impulse response filter means and a second linear finite impulse response filter means in an overlap mode of operation, where the first filter means has a first set of filter coefficients with a first dynamic range and the second filter means has a second set of filter coefficients with a second dynamic range;
    applying the input signal simultaneously to both the first filter means and the second filter means;
    providing a first output signal from the first filter means and a second output signal from the second filter means;
    determining a factor, $\alpha$, as a function of the difference between the first dynamic range and the second dynamic range,
    scaling the second output signal by the factor, $\alpha$, to provide a scaled second output signal;
    combining the scaled second output signal and the first output signal to provide a third output signal;
    controlling the first set of filter coefficients of the first adaptive filter as a function of the third output signal; and
    controlling the second set of filter coefficients of the second adaptive filter.

14. A method for filtering an applied signal comprising the steps of:
    filtering the applied signal in a first linear finite impulse response filter means to provide a first output signal;

filtering the applied signal in a second linear finite impulse response filter means to provide a second output signal;

combining the first output signal and the second output signal to provide a third output signal; and controlling the characteristics of the first filter and the second filter as a function of the third output signal;

where the first filter means performs a coarse filtering of the applied signal relative to the second filter means, which performs a finer filtering of the applied signal.

* * * * *